(12) United States Patent
Chen et al.

(10) Patent No.: US 10,103,722 B2
(45) Date of Patent: Oct. 16, 2018

(54) DIFFERENTIAL SWITCH CIRCUIT

(71) Applicant: Realtek Semiconductor Corp., Hsinchu (TW)

(72) Inventors: Bo-Yu Chen, Taichung (TW); Leaf Chen, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 15/615,079

(22) Filed: Jun. 6, 2017

(65) Prior Publication Data

US 2018/0006638 A1 Jan. 4, 2018

(30) Foreign Application Priority Data

Jun. 29, 2016 (TW) .............................. 105120523 A

(51) Int. Cl.
| | |
|---|---|
| *H03K 17/00* | (2006.01) |
| *H03K 17/0412* | (2006.01) |
| *H03K 17/0416* | (2006.01) |
| *H03K 17/687* | (2006.01) |
| *H03K 17/94* | (2006.01) |
| *H03K 17/06* | (2006.01) |

(52) U.S. Cl.
CPC . *H03K 17/04126* (2013.01); *H03K 17/04163* (2013.01); *H03K 17/063* (2013.01); *H03K 17/687* (2013.01); *H03K 17/94* (2013.01); *H03K 2017/066* (2013.01); *H03K 2217/0054* (2013.01)

(58) Field of Classification Search
None
See application file for complete search history.

(56) References Cited

U.S. PATENT DOCUMENTS

| | | | | |
|---|---|---|---|---|
| 8,860,492 | B2 * | 10/2014 | Yang ...................... | H03K 17/28 327/19 |
| 2013/0271200 | A1 * | 10/2013 | Yang ...................... | H03K 17/28 327/382 |

* cited by examiner

*Primary Examiner* — Long Nguyen
(74) *Attorney, Agent, or Firm* — Birch, Stewart, Kolasch & Birch, LLP

(57) ABSTRACT

A differential switch circuit includes: a first transistor having a first terminal coupled with a first input terminal, a second terminal coupled with a first output terminal, and a control terminal coupled with a switch signal receiving terminal; a second transistor having a first terminal coupled with a second input terminal, a second terminal coupled with a second output terminal, and a control terminal coupled with the switch signal receiving terminal; a central switch element positioned between the control terminals of the first and second transistors; and a switch element control circuit for controlling the central switch element based on a switch signal. When the switch signal turns on the first and second transistors, the switch element control circuit turns off the central switch element, and when the switch signal turns off the first and second transistors, the switch element control circuit turns on the central switch element.

9 Claims, 6 Drawing Sheets

DIFFERENTIAL SWITCH CIRCUIT

CROSS-REFERENCE TO RELATED APPLICATIONS

This application claims the benefit of priority to patent application No. 105120523, filed in Taiwan on Jun. 29, 2016; the entirety of which is incorporated herein by reference for all purposes.

BACKGROUND

The disclosure generally relates to a switch circuit and, more particularly, to a differential switch circuit with the merits of low insertion loss and high signal isolation.

The differential switch circuit is a basic circuit component in many devices. Ideally, the insertion loss of the signal should be as low as possible when the switch circuit is turned, and the isolation between the signal input terminal and the signal output terminal should be as high as possible when the switch circuit is turned off.

However, the conventional differential switch circuit cannot achieve low insertion loss when turned on while achieving high isolation when turned off. Therefore, the conventional differential switch circuit may inversely affect the performance of the overall circuit.

SUMMARY

An example embodiment of a differential switch circuit is disclosed, comprising: a pair of differential signal input terminals including a first input terminal and a second input terminal; a pair of differential signal output terminals including a first output terminal and a second output terminal; a switch signal receiving terminal arranged to operably receive a switch signal for controlling the differential switch circuit; a first transistor, wherein a first terminal of the first transistor is coupled with the first input terminal, a second terminal of the first transistor is coupled with the first output terminal, while a control terminal of the first transistor is coupled with the switch signal receiving terminal; a second transistor, wherein a first terminal of the second transistor is coupled with the second input terminal, a second terminal of the second transistor is coupled with the second output terminal, while a control terminal of the second transistor is coupled with the switch signal receiving terminal; a central switch element positioned on a signal path between the control terminals of the first transistor and the second transistor; and a switch element control circuit, coupled between the switch signal receiving terminal and a control terminal of the central switch element, arranged to operably generate a control circuit according to the switch signal to control the central switch element; wherein when the switch signal turns on the first transistor and turns on the second transistor, the switch element control circuit utilizes the control circuit to turn off the central switch element, and when the switch signal turns off the first transistor and turns off the second transistor, the switch element control circuit utilizes the control circuit to turn on the central switch element.

Both the foregoing general description and the following detailed description are examples and explanatory only, and are not restrictive of the invention as claimed.

DETAILED DESCRIPTION

Reference is made in detail to embodiments of the invention, which are illustrated in the accompanying drawings. The same reference numbers may be used throughout the drawings to refer to the same or like parts, components, or operations.

Figure 1:
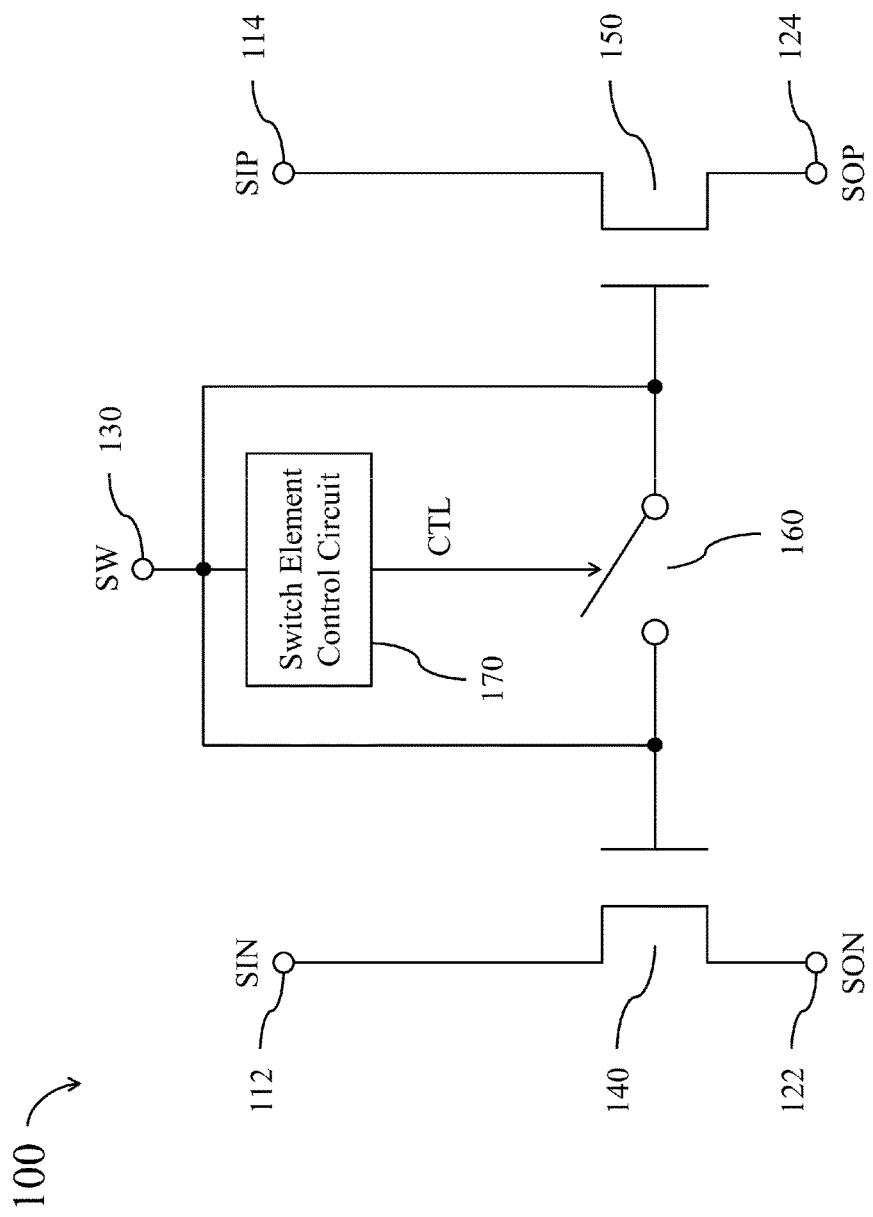
FIGS. 1-6 show simplified functional block diagrams of a differential switch circuit according to different embodiments of the present disclosure.

FIG. 1 shows a simplified functional block diagram of a differential switch circuit 100 according to one embodiment of the present disclosure.

As shown in FIG. 1, the differential switch circuit 100 comprises a pair of differential signal input terminals (formed by a first input terminal 112 and a second input terminal 114) and a pair of differential signal output terminals (formed by a first output terminal 122 and a second output terminal 124). In addition, the differential switch circuit 100 further comprises a switch signal receiving terminal 130, a first transistor 140, a second transistor 150, a central switch element 160, and a switch element control circuit 170.

The switch signal receiving terminal 130 is arranged to operably receive a switch signal SW for controlling the differential switch circuit 100. A first terminal of the first transistor 140 is coupled with the first input terminal 112, a second terminal of the first transistor 140 is coupled with the first output terminal 122, while a control terminal of the first transistor 140 is coupled with the switch signal receiving terminal 130. A first terminal of the second transistor 150 is coupled with the second input terminal 114, a second terminal of the second transistor 150 is coupled with the second output terminal 124, while a control terminal of the second transistor 150 is coupled with the switch signal receiving terminal 130. The central switch element 160 is positioned on a signal path between the control terminal of the first transistor 140 and the control terminal of the second transistor 150, and arranged to operate under control of a control signal CTL. The switch element control circuit 170 is coupled between the switch signal receiving terminal 130 and a control terminal of the central switch element 160, and arranged to operably generate the control signal CTL for controlling the central switch element 160 according to the switch signal SW.

In operations, the first input terminal 112 and the second input terminal 114 are respectively utilized to receive a first input signal SIN and a second input signal SIP of a pair of differential input signals. When the differential switch circuit 100 is turned on, the first output terminal 122 and the second output terminal 124 are respectively utilized to output a first output signal SON and a second output signal SOP to form a pair of differential output signals.

When the switch signal SW is intended to turn on the differential switch circuit 100, the switch signal SW turns on the first transistor 140 and also turns on the second transistor 150, so that the first output terminal 122 and the second output terminal 124 respectively output the first output signal SON and the second output signal SOP. At this moment, the switch element control circuit 170 utilizes the control signal CTL to turn off the central switch element 160, so as to form an open-circuit between the control terminals of the first transistor 140 and the second transistor 150. In this situation, it can be regarded as that a huge resistance exists on the signal path between the control terminals of the first transistor 140 and the second transistor 150.

As a result, a virtual ground cannot be formed between the control terminal of the first transistor 140 and the control terminal of the second transistor 150. In this way, the parasitic effect of the first transistor 140 and the second transistor 150 can be effectively reduced, thereby reducing the insertion loss of the differential switch circuit 100 when the differential switch circuit 100 is turned on.

When the switch signal SW is intended to turn off the differential switch circuit 100, the switch signal SW turns off the first transistor 140 and also turns off the second transistor 150, so that the first output terminal 122 and the second output terminal 124 stop outputting the aforementioned differential output signals. At this moment, the switch element control circuit 170 utilizes the control signal CTL to turn on the central switch element 160, so that the control terminal of the first transistor 140 can be conducted to the control terminal of the second transistor 150. In this situation, a virtual ground is formed between the control terminals of the first transistor 140 and the second transistor 150, which effectively increases the equivalent parasitic capacitance of the first transistor 140 and the second transistor 150.

As a result, residual signal passing through the first transistor 140 and residual signal passing through the second transistor 150 would both flow to the virtual ground point and cancelled by each other, instead of flowing to the first output terminal 122 and the second output terminal 124. Accordingly, the isolation of the differential switch circuit 100 can be effectively enhanced when the differential switch circuit 100 is turned off.

In practice, the first transistor 140 may be realized with various types of transistors, and the second transistor 150 may be realized with the same type of transistor as the first transistor 140. The central switch element 160 may be realized with various circuits that can implement the functionality of a switch, such as various types of transistors.

For example, the first transistor 140 and the second transistor 150 may be realized with n-channel field-effect transistors of the same type. The aforementioned n-channel field-effect transistors may be n-channel junction field-effect transistors (JFET) or n-channel metal-oxide-semiconductor field-effect transistors (MOSFET).

Figure 2:
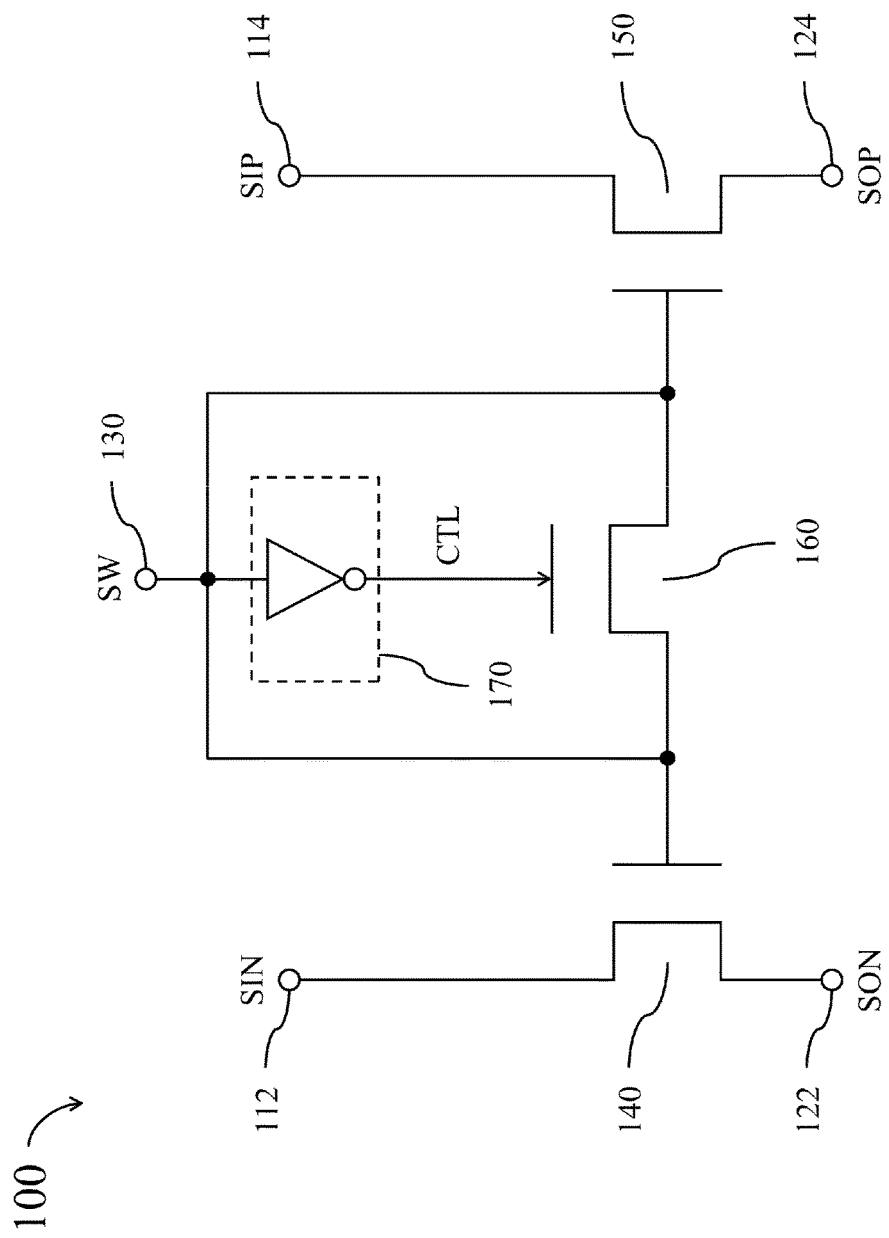

As shown in FIG. 2, the central switch element 160 may be also realized with an n-channel field-effect transistor, but the transistor type of the central switch element 160 is not limited to the same as the first transistor 140 and the second transistor 150.

In the embodiment of FIG. 2, the switch element control circuit 170 is arranged to operably generate a signal having a polarity opposing to the polarity of the switch signal SW as the control signal CTL. As a result, the central switch element 160 is enabled to be kept in the turned-off status when the first transistor 140 and the second transistor 150 are turned on, and is enabled to be kept in the turned-on status when the first transistor 140 and the second transistor 150 are turned off. In practice, the switch element control circuit 170 may be realized with an inverter or a NOT gate.

Figure 3:
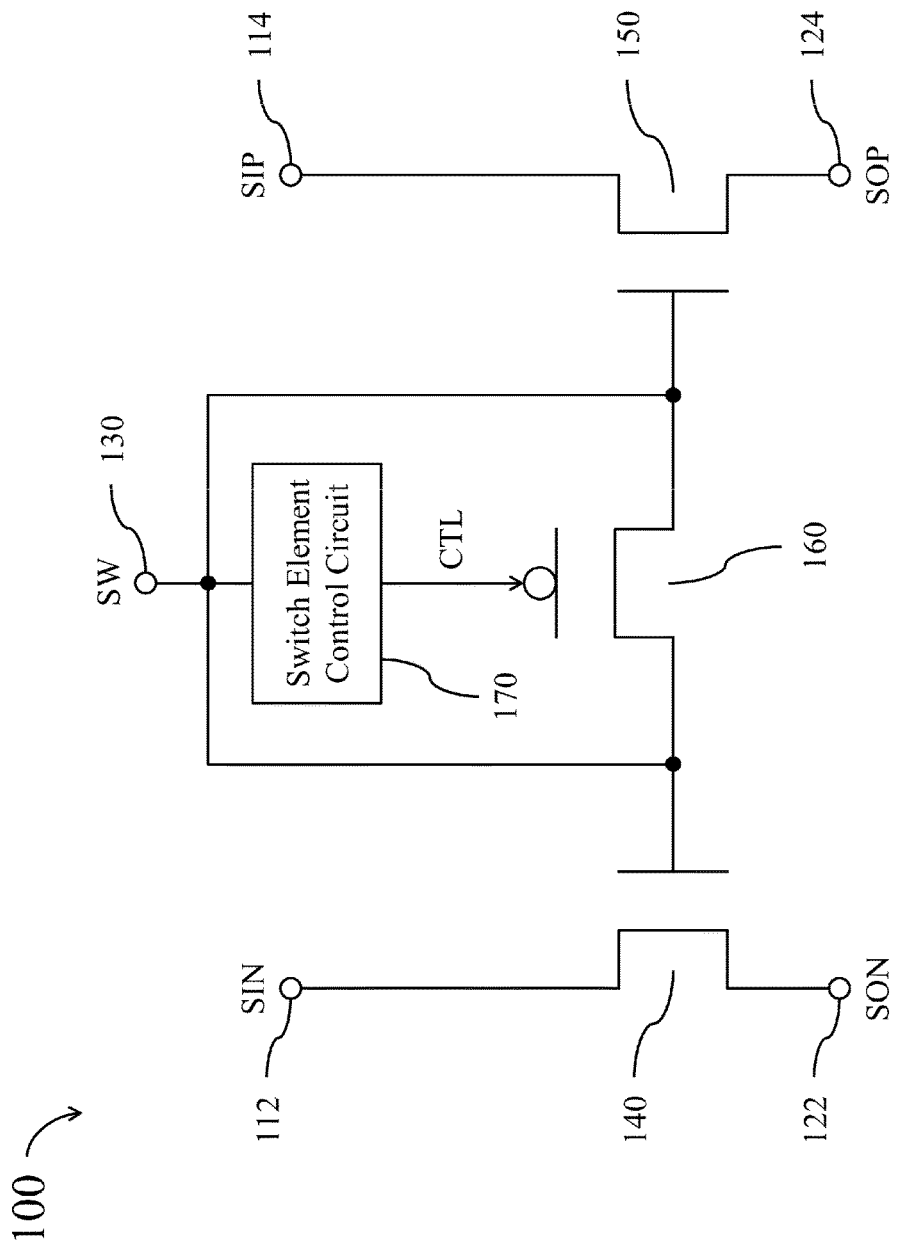

As shown in FIG. 3, the central switch element 160 may be instead realized with a p-channel field-effect transistor, which may be a p-channel JFET or a p-channel MOSFET.

In the embodiment of FIG. 3, the switch element control circuit 170 is arranged to operably generate a signal having same polarity as the switch signal SW to be the control signal CTL. As a result, the central switch element 160 is enabled to be kept in the turned-off status when the first transistor 140 and the second transistor 150 are turned on, and is enabled to be kept in the turned-on status when the first transistor 140 and the second transistor 150 are turned off. In practice, the switch element control circuit 170 may be realized with a wire, two inverters coupled in a series connection, a buffer circuit, or other appropriate circuit elements.

Figure 4:
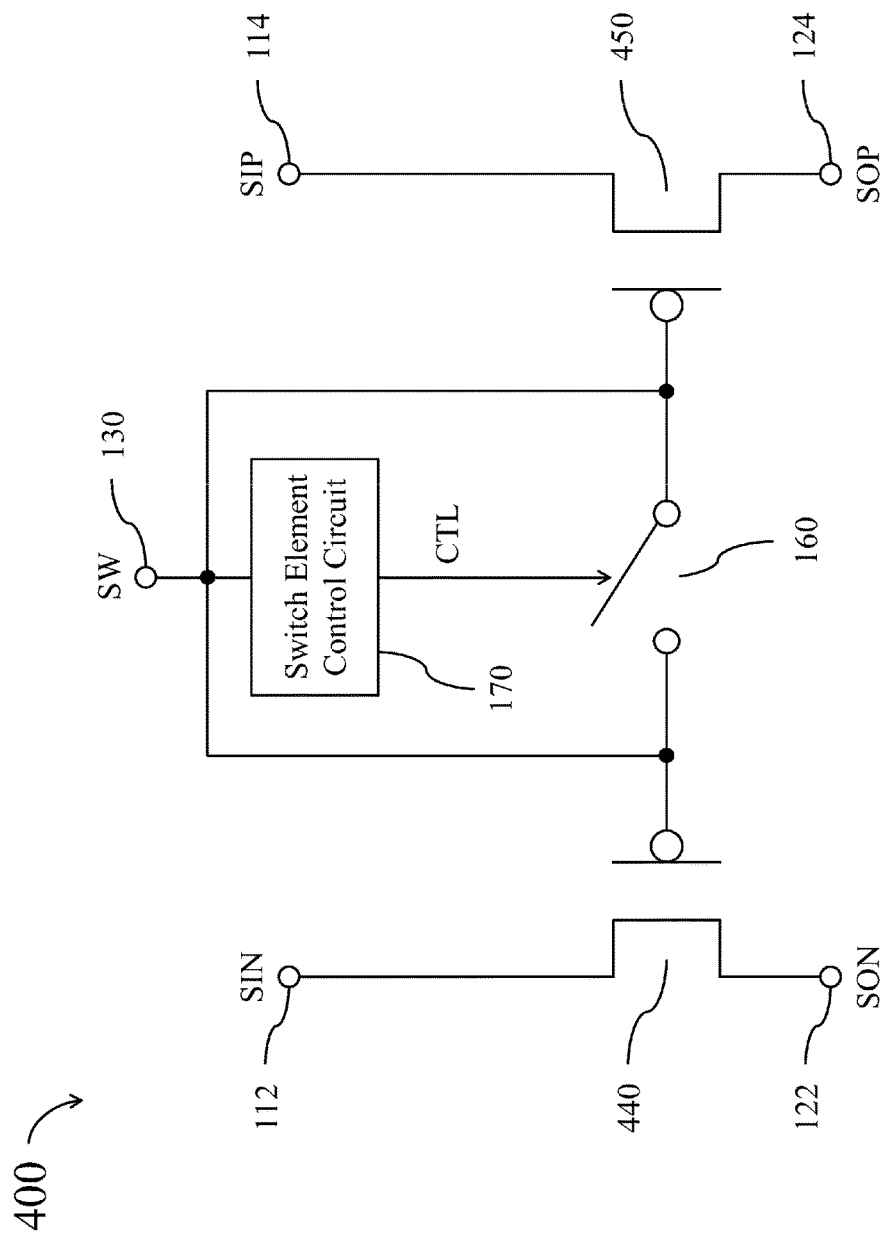

FIG. 4 shows a simplified functional block diagram of a differential switch circuit 400 according to another embodiment of the present disclosure. The first transistor 140 and the second transistor 150 in the previous embodiments are replaced with a first transistor 440 and a second transistor 450 in the differential switch circuit 400. The first transistor 440 and the second transistor 450 are both realized with p-channel field-effect transistors.

The foregoing descriptions regarding the implementations, connections, operations, and related advantages of other corresponding functional blocks in the embodiment of FIG. 1 are also applicable to the embodiment of FIG. 4. For the sake of brevity, those descriptions will not be repeated here.

Similar to the previous embodiments, when the switch signal SW is intended to turn on the differential switch circuit 400, the switch signal SW turns on the first transistor 440 and turns on the second transistor 450, so that the first output terminal 122 and the second output terminal 124 respectively output the first output signal SON and the second output signal SOP. At this moment, the switch element control circuit 170 utilizes the control signal CTL to turn off the central switch element 160, so as to form an open-circuit between the control terminals of the first transistor 440 and the second transistor 450. In this situation, it can be regarded as that a huge resistance exists on the signal path between the control terminals of the first transistor 440 and the second transistor 450.

As a result, a virtual ground cannot be formed between the control terminal of the first transistor 440 and the control terminal of the second transistor 450. In this way, the parasitic effect of the first transistor 440 and the second transistor 450 can be effectively reduced, thereby reducing the insertion loss of the differential switch circuit 400 when the differential switch circuit 400 is turned on.

When the switch signal SW is intended to turn off the differential switch circuit 400, the switch signal SW turns off the first transistor 440 and also turns off the second transistor 450, so that the first output terminal 122 and the second output terminal 124 stop outputting the aforementioned differential output signals. At this moment, the switch element control circuit 170 utilizes the control signal CTL to turn on the central switch element 160, so that the control terminal of the first transistor 440 can be conducted to the control terminal of the second transistor 450. In this situation, a virtual ground is formed between the control terminals of the first transistor 440 and the second transistor 450, which effectively increases the equivalent parasitic capacitance of the first transistor 440 and the second transistor 450.

As a result, residual signal passing through the first transistor 440 and residual signal passing through the second transistor 450 would both flow to the virtual ground point and cancelled by each other, instead of flowing to the first output terminal 122 and the second output terminal 124. Accordingly, the isolation of the differential switch circuit 400 can be effectively enhanced when the differential switch circuit 400 is turned off.

Figure 5:
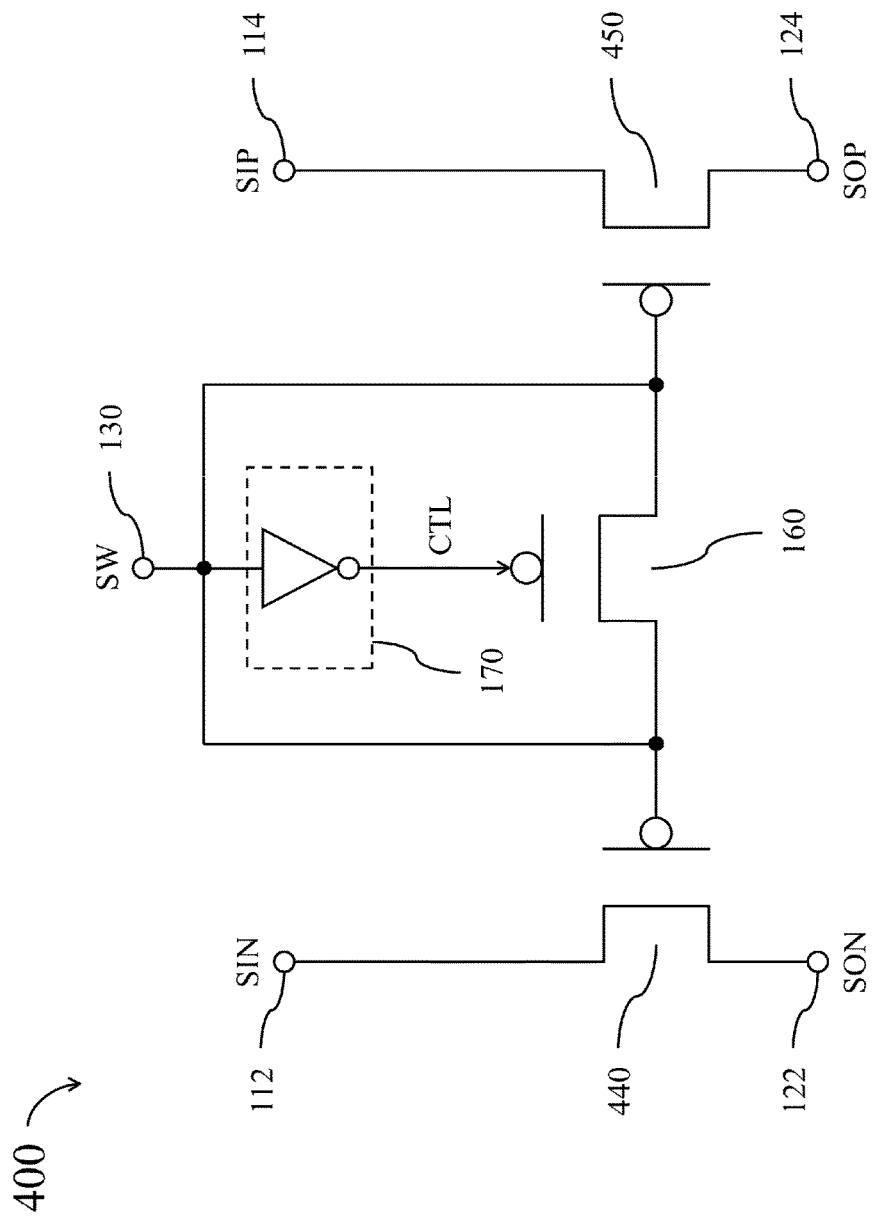

As shown in FIG. 5, the central switch element 160 of the differential switch circuit 400 may be also realized with a p-channel field-effect transistor, but the transistor type of the central switch element 160 is not limited to the same as the first transistor 440 and the second transistor 450. Similar to the embodiment of FIG. 2, the switch element control circuit 170 may generate a signal having a polarity opposing to the polarity of the switch signal SW to be the control signal CTL. As a result, the central switch element 160 is enabled to be kept in the turned-off status when the first transistor 440 and the second transistor 450 are turned on, and is enabled to be kept in the turned-on status when the first transistor 440 and the second transistor 450 are turned off.

Figure 6:
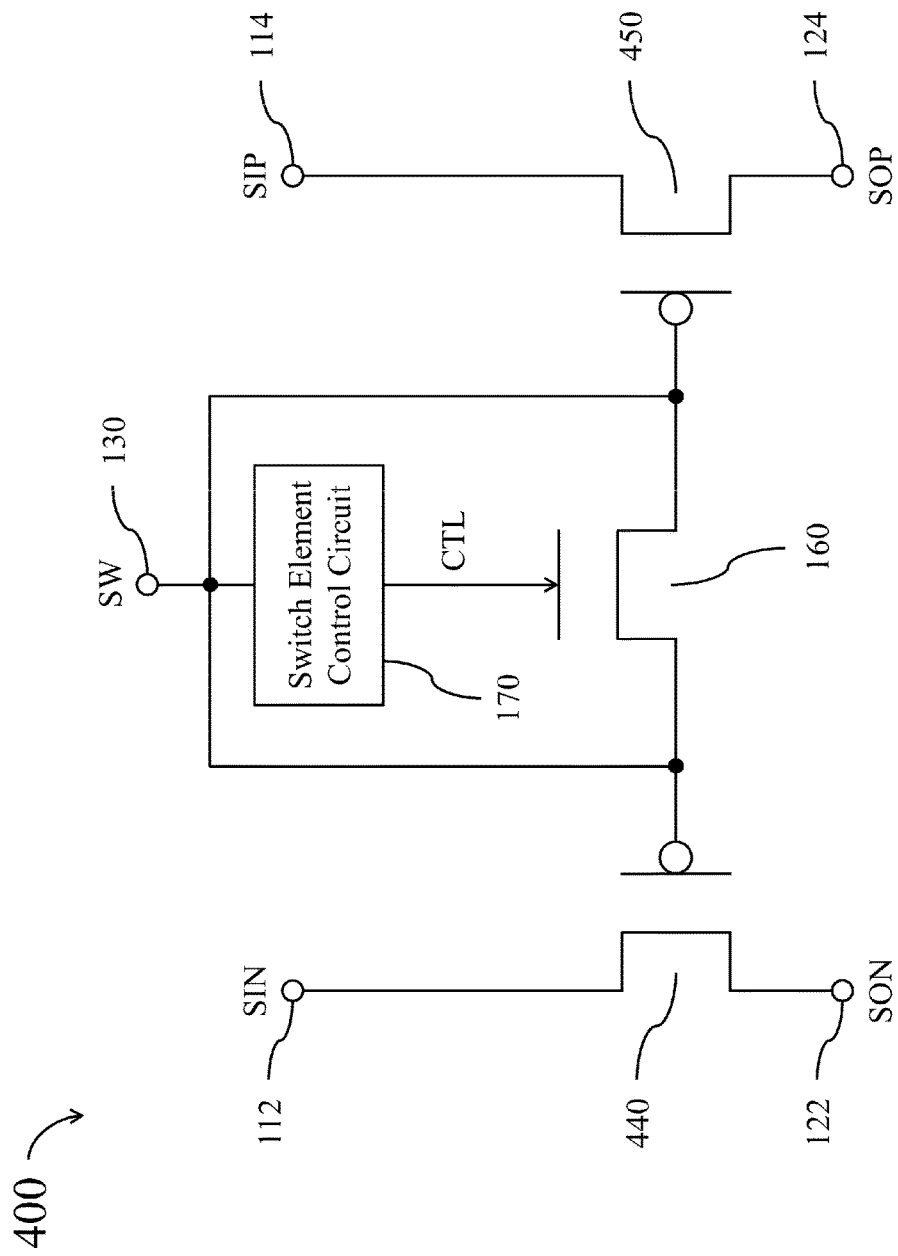

As shown in FIG. 6, the central switch element 160 of the differential switch circuit 400 may be instead realized with an n-channel field-effect transistor. In this situation, similar to the embodiment of FIG. 3, the switch element control circuit 170 may generate a signal having same polarity as the switch signal SW to be the control signal CTL. As a result, the central switch element 160 is enabled to be kept in the turned-off status when the first transistor 440 and the second transistor 450 are turned on, and is enabled to be kept in the turned-on status when the first transistor 440 and the second transistor 450 are turned off.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled with," "couples with," and "coupling with" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

Other embodiments of the invention will be apparent to those skilled in the art from consideration of the specification and practice of the invention disclosed herein. It is intended that the specification and examples be considered as exemplary only, with a true scope and spirit of the invention indicated by the following claims.

What is claimed is:

1. A differential switch circuit (100; 400), comprising:
   a pair of differential signal input terminals including a first input terminal (112) and a second input terminal (114);
   a pair of differential signal output terminals including a first output terminal (122) and a second output terminal (124);
   a switch signal receiving terminal (130) arranged to operably receive a switch signal (SW) for controlling the differential switch circuit (100; 400);
   a first transistor (140; 440), wherein a first terminal of the first transistor (140; 440) is coupled with the first input terminal (112), a second terminal of the first transistor (140; 440) is coupled with the first output terminal (122), while a control terminal of the first transistor (140; 440) is coupled with the switch signal receiving terminal (130);
   a second transistor (150; 450), wherein a first terminal of the second transistor (150; 450) is coupled with the second input terminal (114), a second terminal of the second transistor (150; 450) is coupled with the second output terminal (124), while a control terminal of the second transistor (150; 450) is coupled with the switch signal receiving terminal (130);
   a central switch element (160) positioned on a signal path between the control terminals of the first transistor (140; 440) and the second transistor (150; 450); and
   a switch element control circuit (170), coupled between the switch signal receiving terminal (130) and a control terminal of the central switch element (160), arranged to operably generate a control signal (CTL) according to the switch signal (SW) to control the central switch element (160);
   wherein when the switch signal (SW) turns on the first transistor (140; 440) and turns on the second transistor (150; 450), the switch element control circuit (170) utilizes the control signal (CTL) to turn off the central switch element (160), and when the switch signal (SW) turns off the first transistor (140; 440) and turns off the second transistor (150; 450), the switch element control circuit (170) utilizes the control signal (CTL) to turn on the central switch element (160).

2. The differential switch circuit (100; 400) of claim 1, wherein the first transistor (140) and the second transistor (150) are both n-channel field-effect transistors, while the central switch element (160) is also an n-channel field-effect transistor.

3. The differential switch circuit (100; 400) of claim 2, wherein the switch element control circuit (170) is arranged to operably generate a signal having a polarity opposing to that of the switch signal (SW) to be the control signal (CTL).

4. The differential switch circuit (100; 400) of claim 1, wherein the first transistor (140) and the second transistor (150) are both n-channel field-effect transistors, while the central switch element (160) is a p-channel field-effect transistor.

5. The differential switch circuit (100; 400) of claim 4, wherein the switch element control circuit (170) is arranged to operably generate a signal having same polarity as the switch signal (SW) to be the control signal (CTL).

6. The differential switch circuit (100; 400) of claim 1, wherein the first transistor (140) and the second transistor (150) are both p-channel field-effect transistors, while the central switch element (160) is also a p-channel field-effect transistor.

7. The differential switch circuit (100; 400) of claim 6, wherein the switch element control circuit (170) is arranged to operably generate a signal having a polarity opposing to that of the switch signal (SW) to be the control signal (CTL).

8. The differential switch circuit (100; 400) of claim 1, wherein the first transistor (140) and the second transistor (150) are both p-channel field-effect transistors while the central switch element (160) is an n-channel field-effect transistor.

9. The differential switch circuit (100; 400) of claim 8, wherein the switch element control circuit (170) is arranged to operably generate a signal having same polarity as the switch signal (SW) to be the control signal (CTL).

* * * * *